(12) United States Patent
Cheng et al.

(10) Patent No.: US 8,962,434 B2
(45) Date of Patent: Feb. 24, 2015

(54) FIELD EFFECT TRANSISTORS WITH VARYING THRESHOLD VOLTAGES

(75) Inventors: Kangguo Cheng, Schenectady, NY (US); Bruce B. Doris, Brewster, NY (US); Ali Khakifirooz, Mountain View, CA (US); Alexander Reznicek, Troy, NY (US); Thomas N. Adam, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 13/545,224

(22) Filed: Jul. 10, 2012

(65) Prior Publication Data

US 2014/0015014 A1  Jan. 16, 2014

(51) Int. Cl.
*H01L 21/336* (2006.01)
(52) U.S. Cl.
USPC ........... 438/300; 438/183; 438/184; 438/360; 438/429; 438/595
(58) Field of Classification Search
USPC .......... 438/300, 183, 184, 230, 429, 595, 360
See application file for complete search history.

(56) References Cited

U.S. PATENT DOCUMENTS

| | | | |
|---|---|---|---|
| 5,907,777 A | 5/1999 | Joseph et al. | |
| 5,985,726 A * | 11/1999 | Yu et al. | 438/301 |
| 6,190,952 B1 | 2/2001 | Xiang et al. | |
| 6,380,590 B1 | 4/2002 | Yu | |
| 6,614,079 B2 | 9/2003 | Lee et al. | |
| 6,812,105 B1 | 11/2004 | Dokumaci et al. | |
| 7,880,202 B2 | 2/2011 | Baumgartner | |
| 8,063,450 B2 | 11/2011 | Wernersson et al. | |
| 8,110,467 B2 | 2/2012 | Chang et al. | |
| 2011/0074498 A1 | 3/2011 | Thompson et al. | |
| 2011/0223732 A1 | 9/2011 | Griebenow et al. | |

* cited by examiner

*Primary Examiner* — Thien F Tran
(74) *Attorney, Agent, or Firm* — Steven Meyers; L. Jeffrey Kelly

(57) ABSTRACT

A method including providing a semiconductor substrate including a first semiconductor device and a second semiconductor device, the first and second semiconductor devices including dummy spacers, dummy gates, and extension regions; protecting the second semiconductor device with a mask; removing the dummy spacers from the first semiconductor device; and depositing in-situ doped epitaxial regions on top of the extension regions of the first semiconductor device.

12 Claims, 17 Drawing Sheets

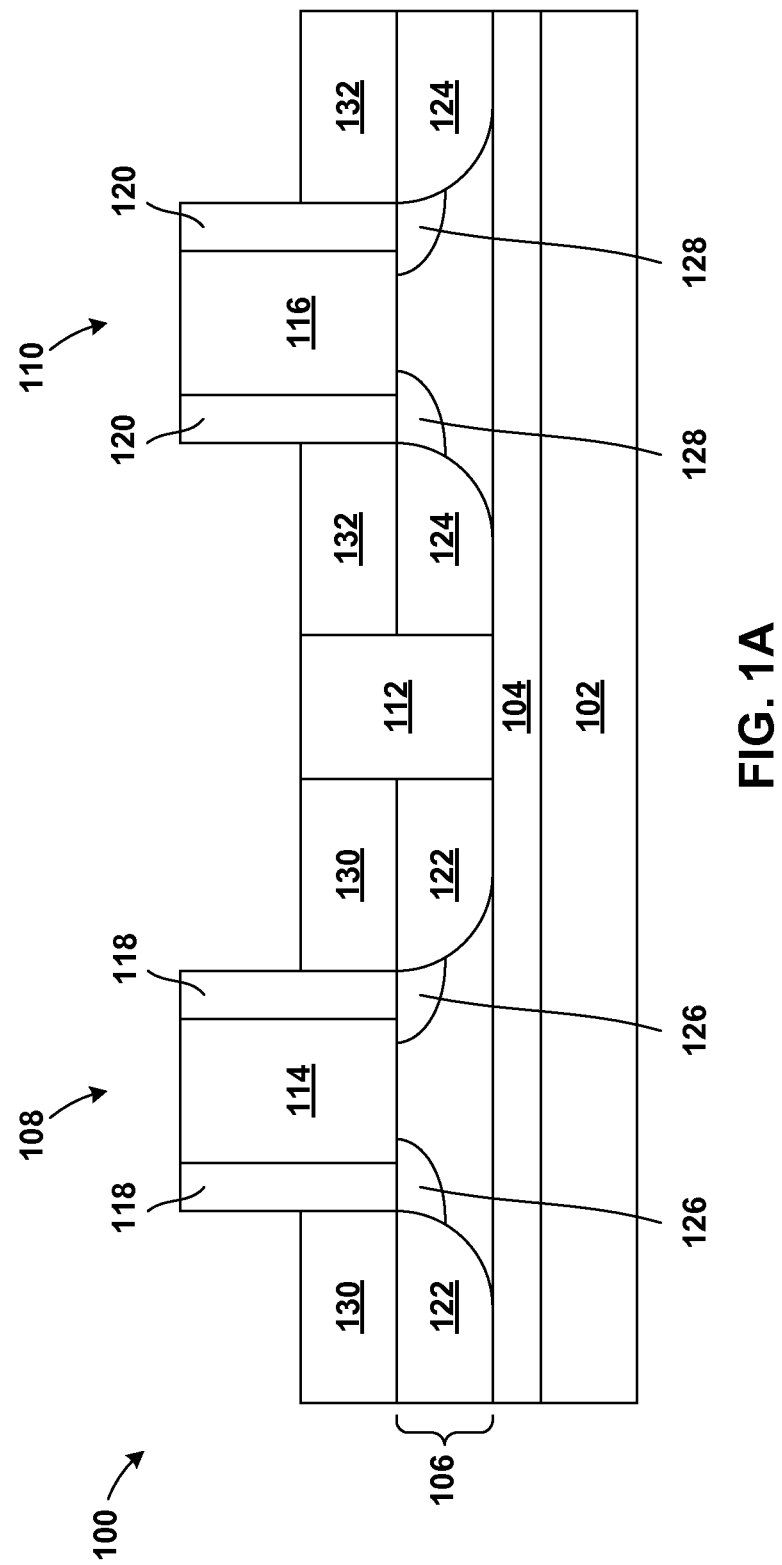

FIELD EFFECT TRANSISTORS WITH VARYING THRESHOLD VOLTAGES

BACKGROUND

1. Field of the Invention

The present disclosure generally relates to integrated circuits, and more particularly to the threshold voltage of field effect transistors.

2. Background of Invention

The need to remain cost and performance competitive in the production of semiconductor devices has caused device density to continually increase in integrated circuits. To facilitate the increase in device density, new technologies are constantly needed to allow the feature size of these semiconductor devices to be reduced.

The push for ever increasing device densities is particularly strong in the design and fabrication of field effect transistors (FETs), such as those used in CMOS technologies. FETs are used in almost all types of integrated circuit design (i.e., microprocessors, memory, etc.). One of the fundamental parameters of FET design is the threshold voltage ($V_T$).

Most integrated circuits require transistors with different threshold voltages to achieve tradeoff between power and performance. The threshold voltage of a FET is determined primarily by the channel doping, the gate dielectric thickness, and gate length. Present methods for providing FETs with different threshold voltages on the same chip require a different masking step followed by a specialized channel ion implant for each different threshold voltage desired. Thus, a chip that requires FETs with five different threshold voltages requires five different masking steps, each followed by a specialized implant of varying dose and energy designed to adjust the threshold voltage. This greatly increases the process complexity with the attending problems, all of which serve to drive chip yield down and costs up.

SUMMARY

According to one embodiment of the present disclosure, a method is provided. The method may include providing a semiconductor substrate including a first semiconductor device and a second semiconductor device, the first and second semiconductor devices including dummy spacers, dummy gates, and extension regions; protecting the second semiconductor device with a mask; removing the dummy spacers from the first semiconductor device; and depositing in-situ doped epitaxial regions on top of the extension regions of the first semiconductor device.

According to another exemplary embodiment, a structure is provided. The structure may include a semiconductor substrate including a first semiconductor device and a second semiconductor device; and a pair of in-situ doped epitaxial regions positioned directly above a pair of extension regions of the first semiconductor device, the first semiconductor device including a different threshold voltage from the second semiconductor device.

According to another exemplary embodiment, a method is provided. The method may include providing a semiconductor substrate including a first semiconductor device and a second semiconductor device, the first and second semiconductor devices including dummy spacers, and dummy gates; protecting the second semiconductor device with a first mask; removing the dummy spacers from the first semiconductor device; depositing in-situ doped epitaxial regions on top of the semiconductor substrate of the first semiconductor device; protecting the first semiconductor device with a second mask; removing the dummy spacers from the second semiconductor device; and depositing in-situ doped epitaxial regions on top of the semiconductor substrate of the second semiconductor device.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

FIGS. 1A-1H illustrate the steps of a method of forming multiple FETs with different threshold voltages according to one exemplary embodiment.

FIG. 1A depicts dummy devices formed on a semiconductor substrate used in forming multiple FETs with varying threshold voltages according to one exemplary embodiment.

FIG. 1B depicts the deposition of an inter-layer dielectric material and the subsequent removal of a pair of dummy spacers of a first semiconductor device according to one exemplary embodiment.

FIG. 1C depicts in-situ doped epi regions applied to a pair of extension regions of the first semiconductor device according to one exemplary embodiment.

FIG. 1D depicts the removal of the remaining dummy gates and dummy spacers according to one exemplary embodiment.

FIG. 1E depicts the deposition of a dielectric material according to one exemplary embodiment.

FIG. 1F depicts the deposition of a gate dielectric on top of the dielectric material according to one exemplary embodiment.

FIG. 1G depicts the formation of metal gates on top of the gate dielectric and the final structure according to one exemplary embodiment.

FIG. 1H depicts the final structure in which the in-situ doped epitaxial regions are formed after a portion of the extension regions of the first semiconductor device have been recessed according to one exemplary embodiment.

FIG. 2A depicts dummy devices formed on a semiconductor substrate used in forming multiple FETs with varying threshold voltages according to one exemplary embodiment.

FIG. 2B depicts the deposition of an inter-layer dielectric material and the subsequent removal of a first pair of dummy spacers of a first device according to one exemplary embodiment.

FIG. 2C depicts a first pair of in-situ doped epi regions applied to a channel region of the first semiconductor device according to one exemplary embodiment.

FIG. 2D depicts the removal of a pair of dummy spacers of the second semiconductor device and the subsequent formation of a second pair of in-situ doped epi regions applied to a channel region of the second semiconductor device according to one exemplary embodiment.

FIG. 2E depicts the removal of the dummy gates of both the first and second semiconductor devices according to one exemplary embodiment.

FIG. 2F depicts the deposition of a dielectric material according to one exemplary embodiment.

FIG. 2G depicts the deposition of a gate dielectric on top of the dielectric material according to one exemplary embodiment.

FIG. 2H depicts the formation of metal gates on top of the gate dielectric and the final structure according to one exemplary embodiment.

FIG. 2I depicts the final structure in which the in-situ doped epitaxial regions are formed after a portion of the channel region of the first and second semiconductor devices have been recessed according to one exemplary embodiment.

The drawings are not necessarily to scale. The drawings are merely schematic representations, not intended to portray specific parameters of the disclosure. The drawings are intended to depict only typical embodiments of the disclosure. In the drawings, like numbering represents like elements.

DETAILED DESCRIPTION

Figure 1B:
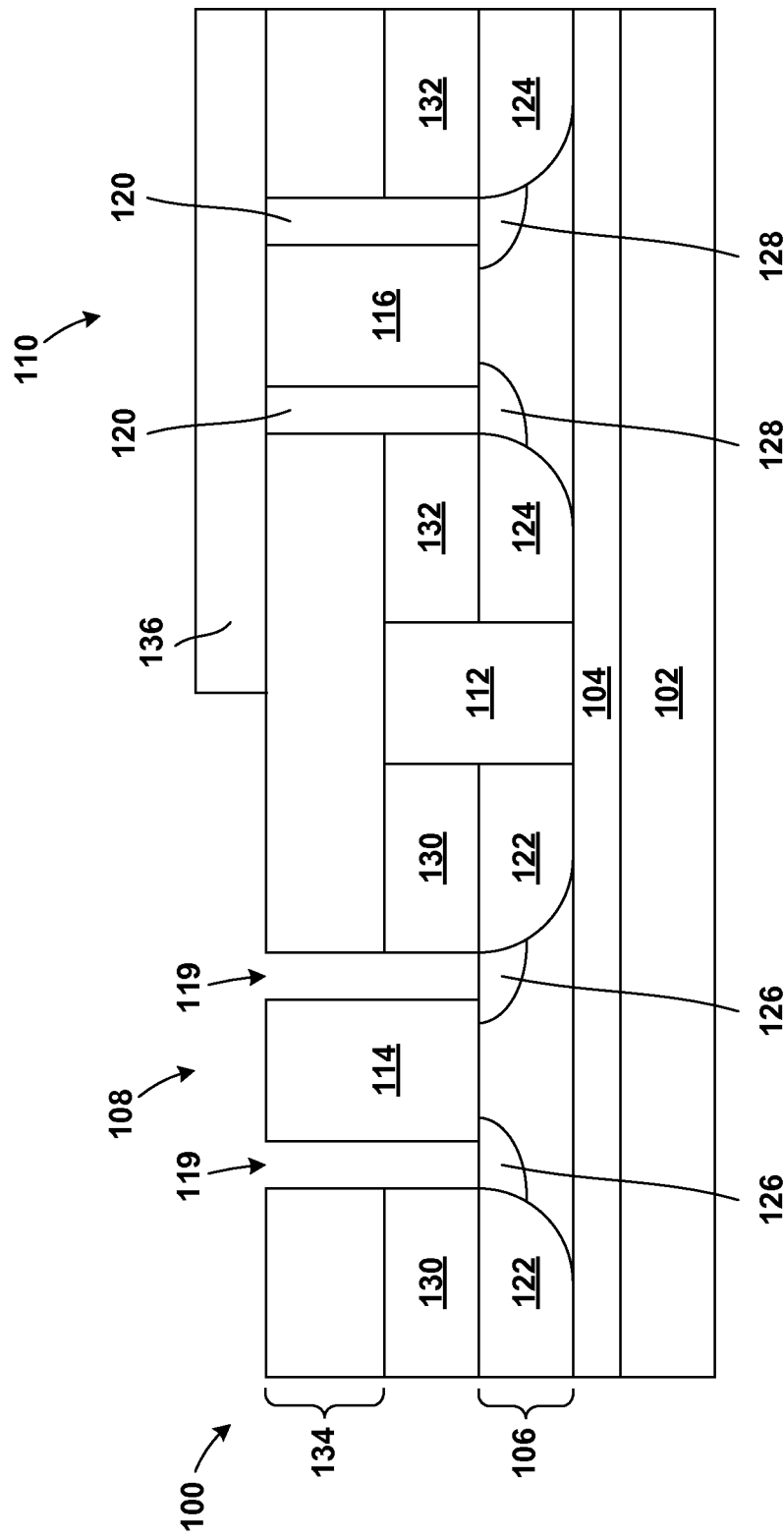

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present disclosure which provides a method of forming multiple field effect transistors with varying threshold voltages will now be described in greater detail by referring to the accompanying FIGS. 1A-1H.

Referring now to FIG. 1A, a structure 100 is shown. The structure 100 includes a semiconductor-on-insulator (SOI) substrate. The SOI substrate employed in the present invention may include a base substrate 102, a buried dielectric layer 104 (e.g., buried oxide) formed on top of the base substrate 102, and a SOI layer 106 formed on top of the buried dielectric layer 104. The buried dielectric layer 104 isolates the SOI layer 106 from the base substrate 102. The base substrate 102 may be made from any of several known semiconductor materials such as, for example, a bulk silicon substrate. Other non-limiting examples include silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may include a thickness ranging from 0.5 mm to about 1.5 mm.

The buried dielectric layer 104 may be formed from any of several dielectric materials. Non-limiting examples include, for example, oxides, nitrides and oxynitrides of silicon. Oxides, nitrides and oxynitrides of other elements are also envisioned. In addition, the buried dielectric layer 104 may include crystalline or non-crystalline dielectric material. Moreover, the buried dielectric layer 104 may be formed using any of several methods. Non-limiting examples include ion implantation methods, thermal or plasma oxidation or nitridation methods, chemical vapor deposition methods and physical vapor deposition methods. In one embodiment, the buried dielectric layer 104 may be about 150 nm thick. Alternatively, the buried dielectric layer 104 may include a thickness ranging from about 10 nm to about 500 nm.

The SOI layer 106 may include any of the several semiconductor materials included in the base substrate 102. In general, the base substrate 102 and the SOI layer 106 may include either identical or different semiconducting materials with respect to chemical composition, dopant concentration and crystallographic orientation. In one particular embodiment of the present invention, the base substrate 102 and the SOI layer 106 include semiconducting materials that include at least different crystallographic orientations. Typically the base substrate 102 or the SOI layer 106 include a {110} crystallographic orientation and the other of the base substrate 102 or the SOI layer 106 includes a {100} crystallographic orientation. Typically, the SOI layer 106 includes a thickness ranging from about 5 nm to about 100 nm. Methods for making the SOI layer 106 are well known in the art. Non-limiting examples include SIMOX (Separation by Implantation of Oxygen), wafer bonding, and ELTRAN® (Epitaxial Layer TRANsfer).

With continued reference to FIG. 1A, a first semiconductor device 108 and a second semiconductor device 110 are shown at one stage of fabrication. Many different methods for forming semiconductor devices are known in the art. As an example, semiconductor devices may be fabricated using known replacement gate techniques. Replacement gate fabrication techniques generally include forming the semiconductor device around a dummy or sacrificial gate and later removing the dummy gate and replacing it with a metal gate. The semiconductor devices 108, 110 in FIG. 1A are shown with dummy gates 114, 116. For example, the dummy gates 114, 116 may be formed from silicon nitride. In one embodiment, the dummy gates 114, 116 may be formed form polysilicon.

Dummy spacers 118, 120 may then be formed, typically by conformally depositing or growing a dielectric such as silicon dioxide, followed by a directional etch that removes the dielectric from the horizontal surfaces while leaving it on the sidewalls of the dummy gates 114, 116. For example, the dummy spacers 118, 120 may include an oxide or nitride. In one embodiment, the dummy spacers 118, 120 may have a horizontal width ranging from about 3 nm to about 30 nm, with 10 nm being most typical.

Source/drain regions 122, 124 may be formed in the SOI layer 106 by using a suitable implant technique known in the art. Extension regions 126, 128 may then be formed using any suitable technique known in the art such as angled implant. The extension regions 126, 128 may generally be formed with the same dopants used to form the source/drain regions 122, 124. The structure 100 may also include some form of isolation situated between semiconductor devices 108, 110 to electrically insulate them from one another. For example, a shallow trench isolation feature 112 may be used to insulate the semiconductor devices 108, 110 from each other.

In one embodiment, the semiconductor devices may be thin channel devices in which the SOI layer 106 may have a thickness of about 50 nm or less. Thin channel devices may be used to further address device scaling limitations. Thin channel devices may suffer from increased resistance due to the thinned SOI layer 106. One solution used to counter increased device resistance inherent in thin channel devices may be the use of raised source/drain regions 130, 132. The raised source/drain regions 130, 132 may be formed by selective epitaxial growth. In one embodiment, the raised source/drain regions 130, 132 may be formed by selective epitaxial SiGe growth for p-type devices and Si or Si:C for n-type devices. The epitaxy film can be doped either in-situ or ex-situ, for example during epitaxial growth of after epitaxial growth.

Referring now to FIG. 1B, an inter-layer dielectric (ILD) layer 134 may be deposited on top of the structure 100. A chemical mechanical polishing technique may be used to remove the excess ILD layer 134 selective to a top surface of the dummy gates 114, 116 and dummy spacers 118, 120. Thus, the ILD layer 134 remains between the semiconductor devices 108, 110 and on top of the raised source/drain regions 130, 132. Next, a mask layer 136 may be applied above the second semiconductor device 110 and the dummy spacers 118 (shown in FIG. 1A) may be selectively removed producing a pair of openings 119, as shown in FIG. 1B. The mask layer 136 can be a soft mask such as photoresist or a hardmask layer such as silicon nitride. Soft mask is suitable for implantation and hardmask is suitable for epitaxy growth. When soft mask is used, it can be removed, for example, by ashing, after implantation but before dopant activation annealing. When hardmask mask is used, it can be removed either before or after dopant activation anneal. The dummy spacers 118 may be removed using any suitable etching technique such as dry etch, wet etch, or combination of both. The removal technique used to remove the dummy spacers 118 may be selective to the ILD layer 134 and the dummy gate 114.

Figure 1C:
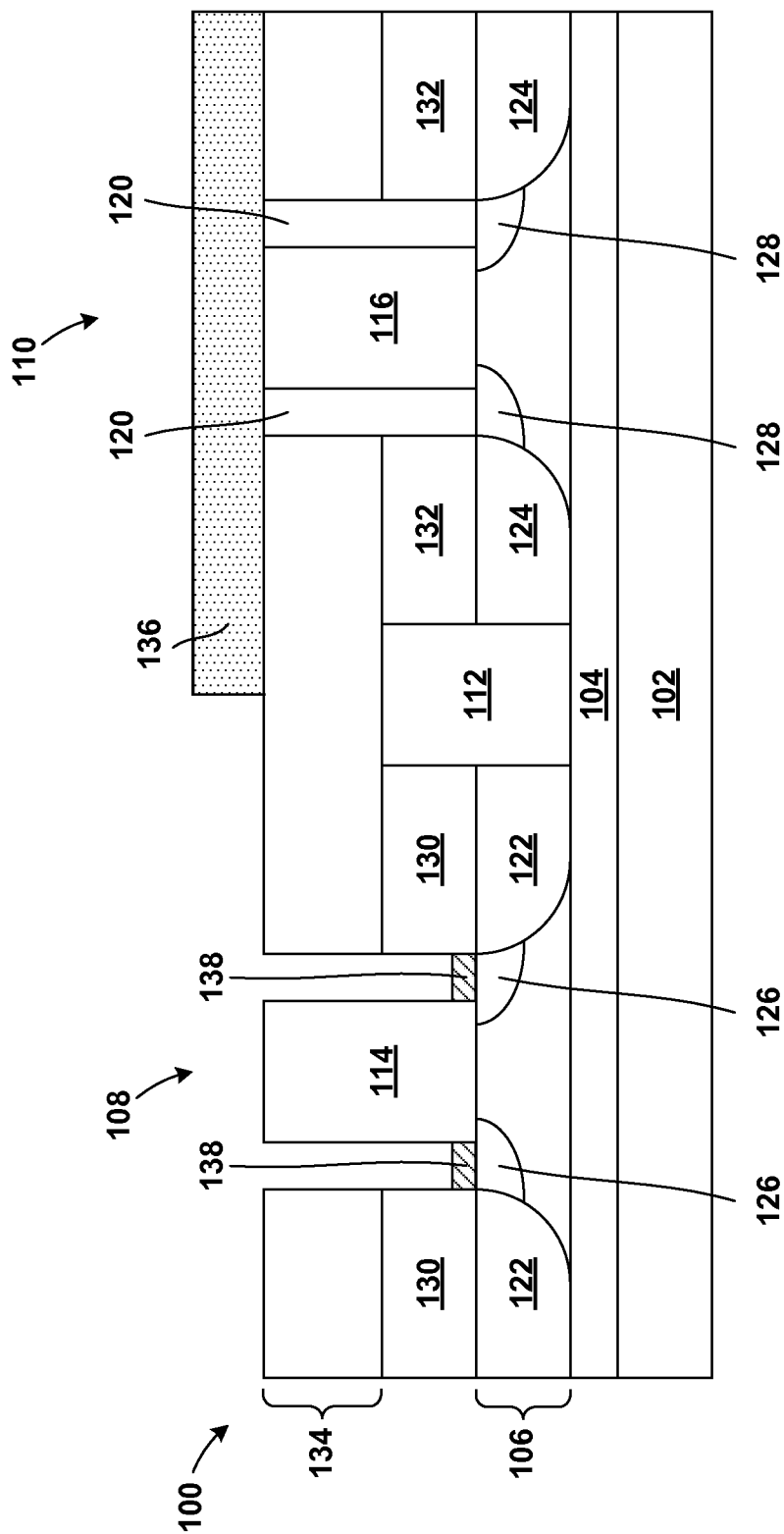

Referring now to FIG. 1C, an extension doping technique may be applied to the extension regions 126 of the first semiconductor device 108. Depending on the dopants used the effective gate length of the first semiconductor device 108 may change while maintaining the device's physical gate length. The threshold voltage of a semiconductor device may strongly depend on the gate length of that particular device. A device having a relatively long effective gate length may have a relatively high threshold voltage, while a device having a relatively short effective gate length may have a relatively low threshold voltage. Generally, introduction of n-dopants into a p-doped extension region may increase the device's effective channel length thereby increasing the device's threshold voltage. Whereas, generally introduction of p-dopants into an n-doped extension region decreases the device's effective channel length thereby decreasing the device's threshold voltage.

In one embodiment, the extension doping technique may include the formation of in-situ doped epi regions 138. Depending on the desired result epitaxial silicon, silicon germanium, of silicon carbon may be used. A number of different sources may be used for the deposition of epitaxial silicon, silicon germanium, and Si:C. n-type dopants such as phosphorus, arsenic, and p-type dopants such as boron and indium can be incorporated into epitaxy films during epitaxial growth. The temperature for epitaxial silicon deposition typically ranges from about 450° C. to about 900° C. The in-situ doped epi regions 138 may have a vertical thickness ranging from about 3 nm to about 15 nm, and may generally have a horizontal width, equal to or less than, one of the pair of openings 119 produced by the removal of the dummy spacers 118.

In one embodiment, a p-type epitaxy film may be provided by selective-epitaxial growth of SiGe. The Ge content of the epitaxial grown SiGe may range from 5% to 60%, by atomic weight %. In another embodiment, the Ge content of the epitaxial grown SiGe may range from 10% to 40%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In yet another embodiment, the single crystal semiconductor material is composed of epitaxially grown Si:C or carbon doped silicon. The carbon (C) content of the epitaxial grown Si:C ranges from 0.3% to 10%, by atomic weight %. In another embodiment, the carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown.

Alternative extension doping techniques may include implantation, plasma doping, gas phase doping, or any suitable combination thereof in which no epitaxial layer is deposited and the extension regions 126 of the first device 108 may be additionally doped.

After deposition of the in-situ doped epi regions 138 an annealing process may be performed on the structure 100 to further activate the dopants. For example, a flash anneal or laser anneal may be used to activate the dopants.

In one embodiment the annealing process may be carried out at a relatively high annealing temperature, ranging from about 700° C. to about 1350° C. using either a continuous heating regime or various ramp and soak heating cycles, for a duration ranging from about 1 nano second to about 1000 seconds. More preferably, the first annealing step may be carried out at an annealing temperature ranging from about 900° C. to about 1300° C. and for a duration ranging from about 1 millisecond to about 1 second. Most preferably, the first annealing step may be carried out at an annealing temperature ranging from about 1000° C. to about 1250° C. and for a duration from about 1 milliseconds to about 100 milliseconds. In one embodiment, the first annealing step may be initiated by raising the surrounding temperature of the entire structure from ambient temperature to the desired annealing temperature at a ramp rate from about 10° C./second to about 300° C./second, more preferably from about 50° C./second to about 200° C./second, and most preferably from about 100° C./second to about 150° C./second. Further, it is preferred that the annealing process may be terminated by lowering the surrounding temperature of the entire structure to below 100° C. within a time period from about 1 seconds to about 1000 seconds. As a result of the annealing process the dopants introduced in the in-situ doped epi regions 138 may further migrate downward into the extension regions 126.

Figure 1D:
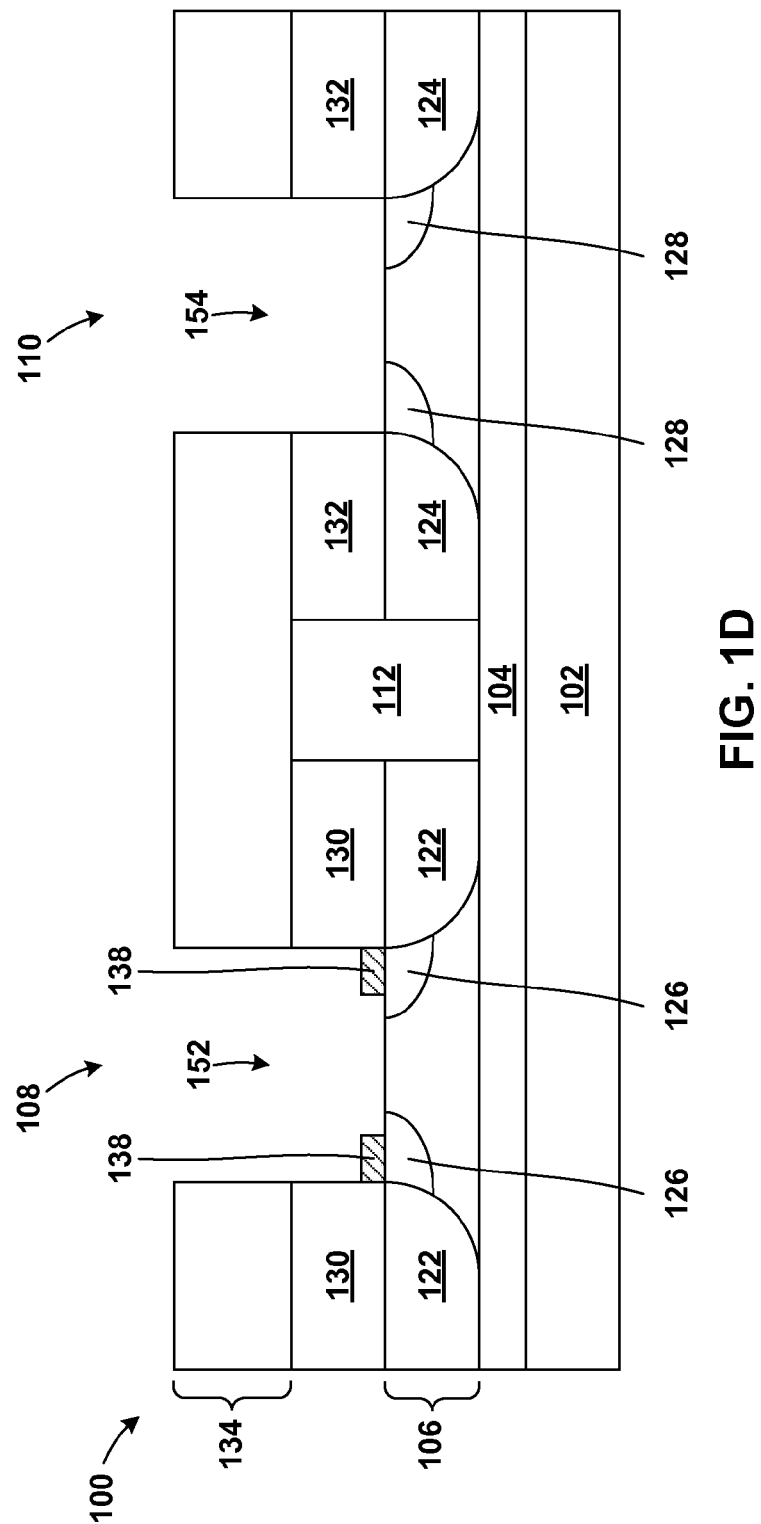

Referring now to FIG. 1D, after the mask layer 136 has been removed the dummy gates 114, 116 and the dummy spacers 120 may be removed using any suitable etching technique such as dry etch, wet etch, or a combination of both. In one embodiment, the dummy gates 114, 116 and the dummy spacers 120 may be removed using dry etch such as plasma etch. Removal of the dummy gates 114, 116 and the dummy spacers 120 yields a first opening 152 at the first device 108 and a second opening 154 at the second device 110.

Figure 1E:
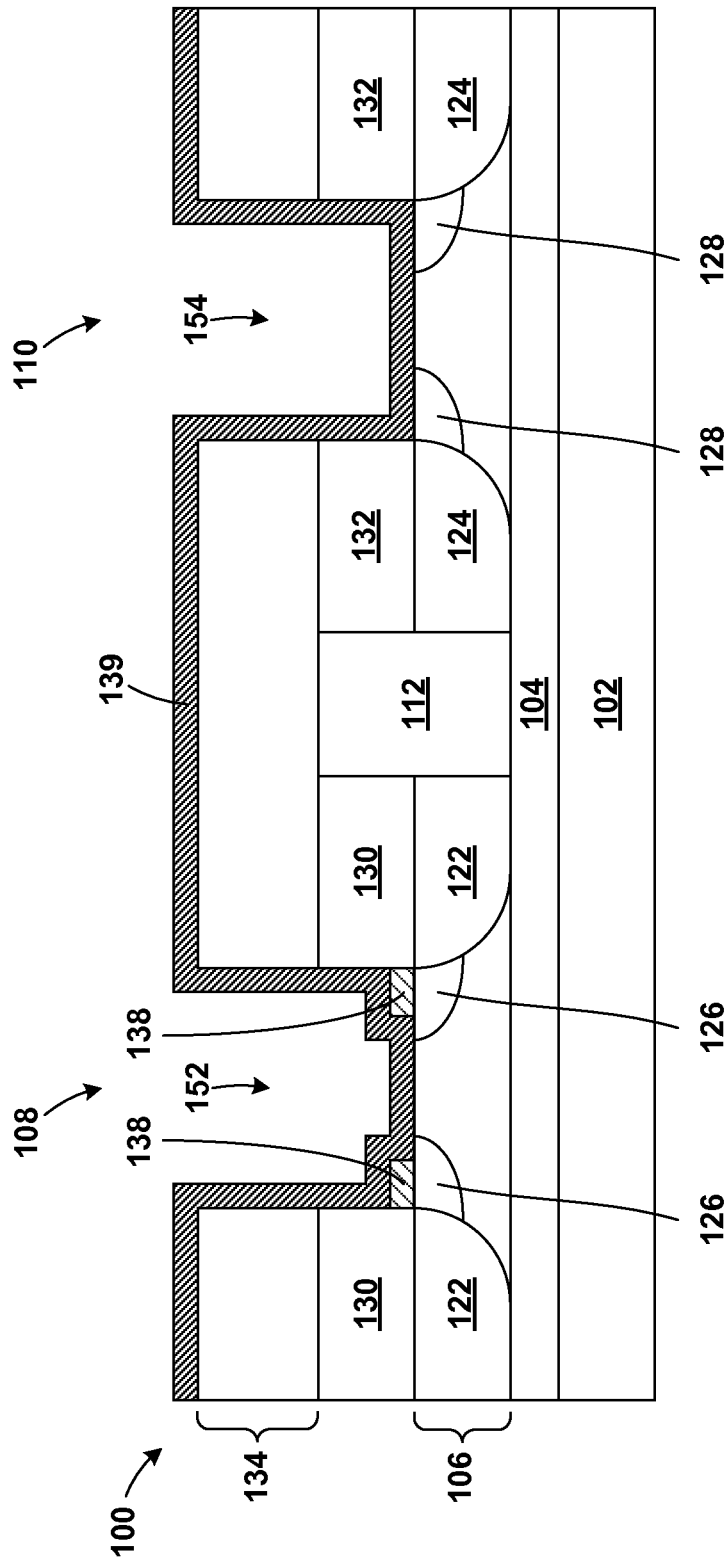

Referring now to FIG. 1E, a dielectric material 139 may be conformally deposited on the surface of the structure 100 including within the openings 152, 154. The dielectric material 139 may be deposited by any technique known in the art, for example by atomic layer deposition (ALD), chemical vapor deposition (CVD), atomic layer deposition (PVD), molecular beam deposition (MBD), pulsed laser deposition (PLD), or liquid source misted chemical deposition (LSMCD). The dielectric material 139 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum. In one embodiment the dielectric material 139 may be silicon nitride. The dielectric material 139 may be deposited with a thickness ranging from about 3 nm to about 30 nm, and more typically from about 5 nm to about 10 nm. A removal technique, for example reactive ion etching, may be used to remove the dielectric material 139 from the horizontal surfaces including a top surface of the ILD layer 134 and the bottoms of the openings 152, 154 while leaving it on the sidewalls of the openings 152, 154. The dielectric material 139 remaining on the sidewalls of the openings 152, 154 forms sidewall spacers 140, 142, as shown in FIG. 1F.

Figure 1F:
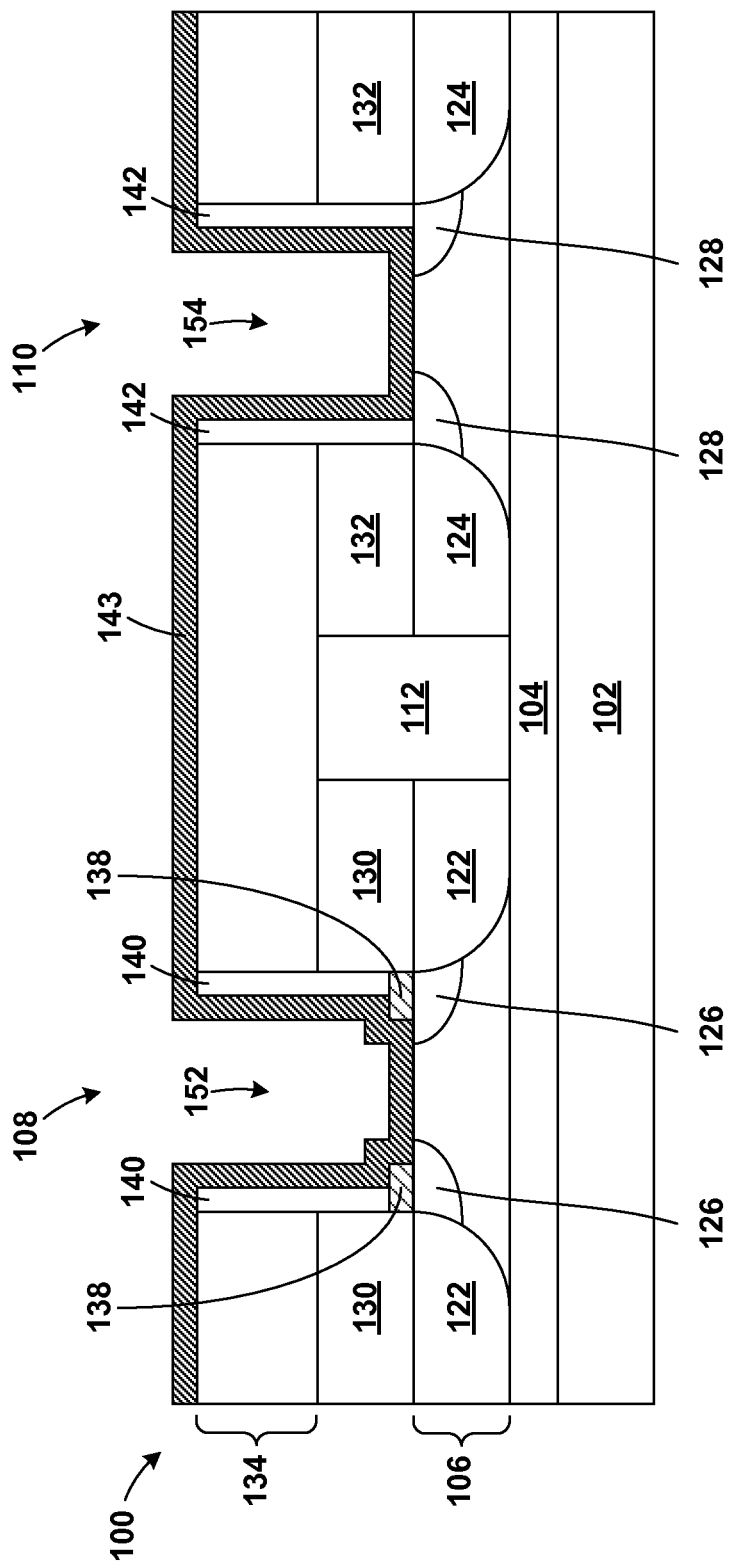

Referring now to FIG. 1F, a gate dielectric layer 143 may be conformally deposited on the surface of the structure 100 including within the openings 152, 154 and on top of the sidewall spacers 140, 142. The gate dielectric layer 143 may be deposited by any technique known in the art, for example by atomic layer deposition (ALD), chemical vapor deposition (CVD), atomic layer deposition (PVD), molecular beam deposition (MBD), pulsed laser deposition (PLD), or liquid source misted chemical deposition (LSMCD).

The gate dielectric layer 143 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum. The gate dielectric layer 143 may be deposited with a thickness ranging from about 0.5 nm to about 6 nm, and more typically from about 1.2 nm to about 3 nm. The gate dielectric layer 143 may have an effective oxide thickness on the order of or less than 1 nm.

Figure 1G:
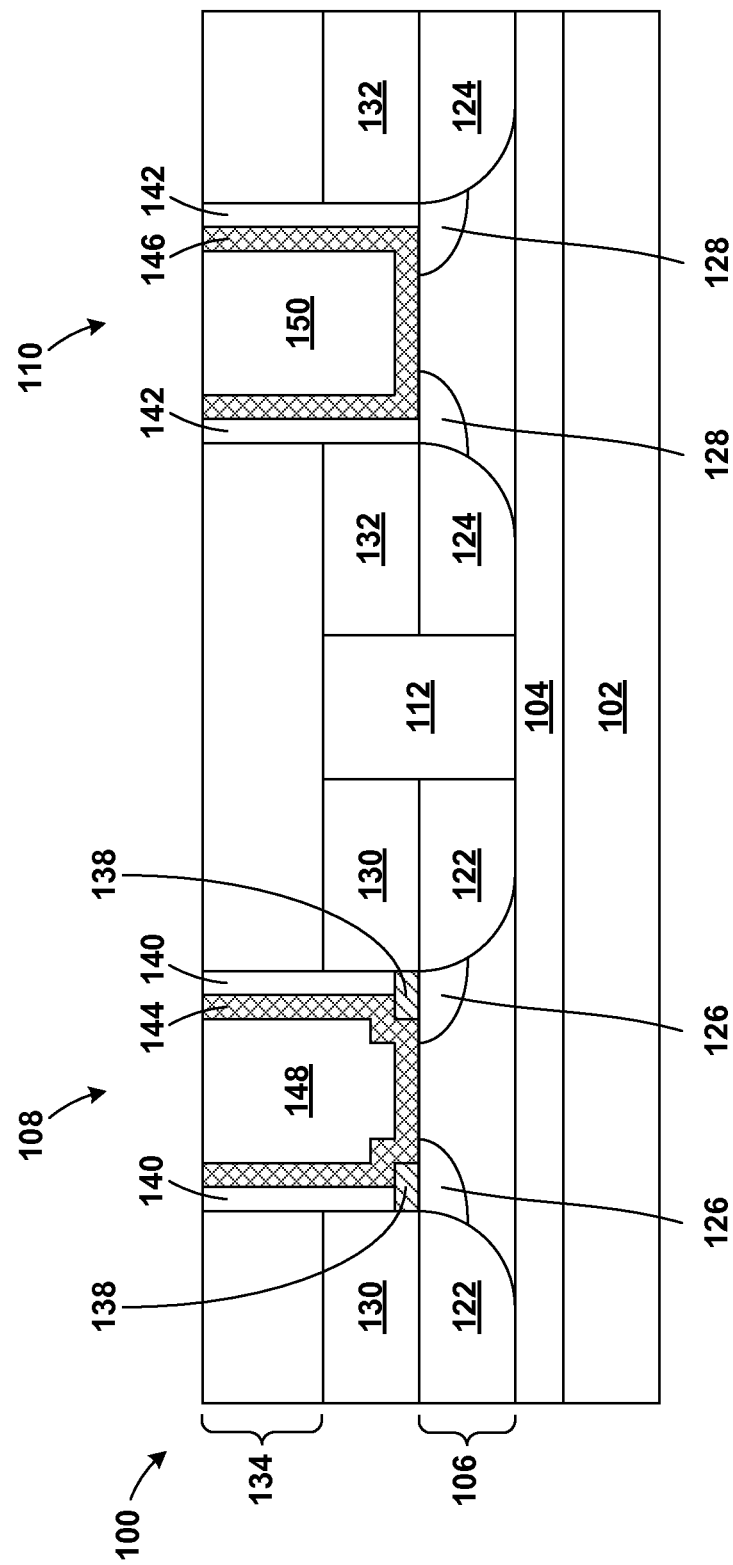

Referring now to FIG. 1G, metal gates 148, 150 may be formed on top of the gate dielectrics 144, 146. The metal gates 148, 150 may be deposited by any technique known in the art, for example by atomic layer deposition (ALD), chemical vapor deposition (CVD), atomic layer deposition (PVD), molecular beam deposition (MBD), pulsed laser deposition (PLD), or liquid source misted chemical deposition (LSMCD). The metal gates 148, 150 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC, and any combination of those materials.

A chemical mechanical polishing technique may be used to remove the metal gate 148, 150 from the top of the structure 100 while leaving it on the sidewalls and bottoms of the openings 152, 154. The gate dielectric layer 143 can be removed selective to the top surface of the ILD layer 134. The gate dielectric layer 143 remaining on the sidewalls and bottoms of the openings 152, 154 forms gate dielectrics 144, 146, as shown in FIG. 1G.

Furthermore, a gate capping layer (not shown) may be positioned on top of the metal gates 148, 150. The gate capping layer may include, for example, TiN, W, Ti, Al, Ta, TaN, Co, and Ni.

Figure 1H:
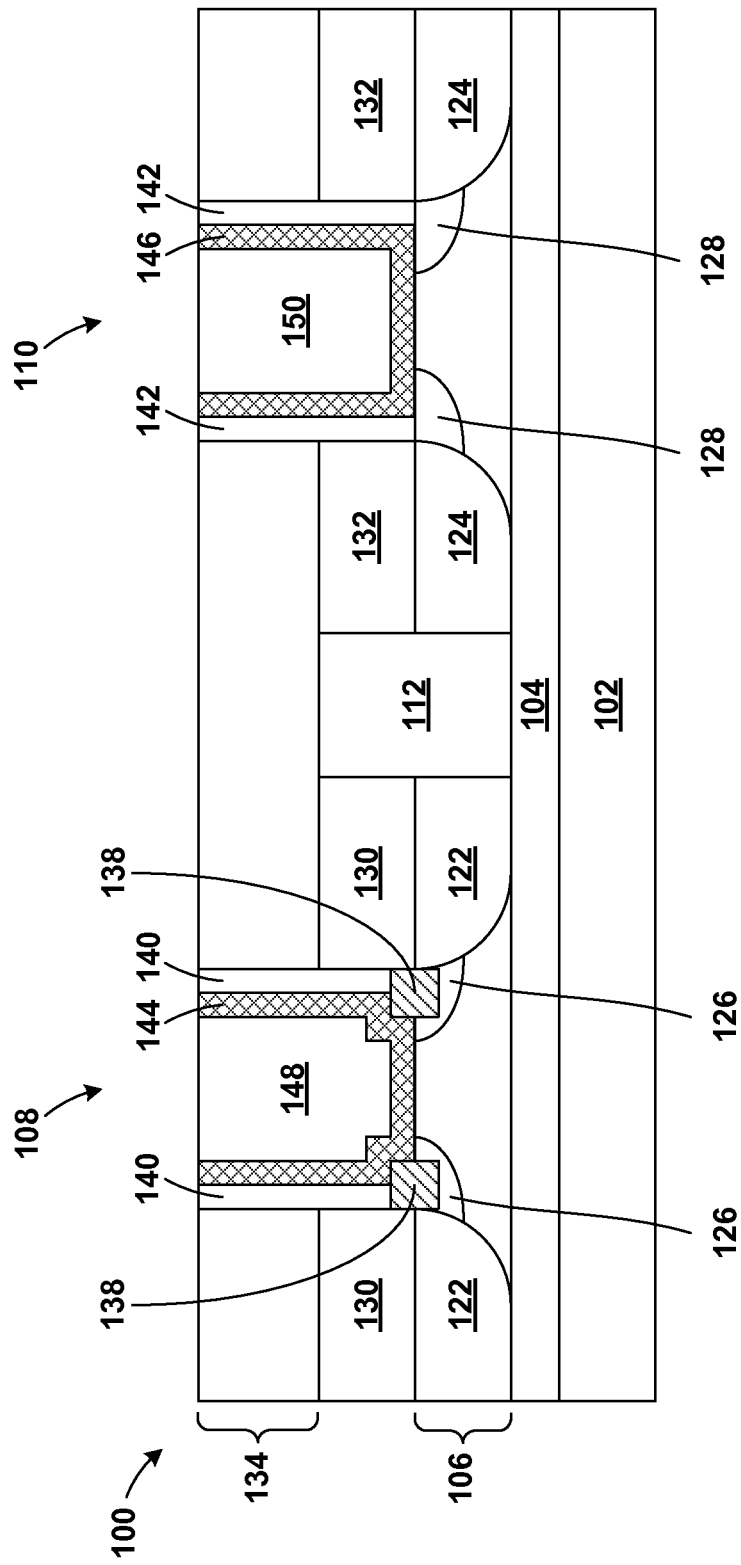

Referring now to FIG. 1H, in one embodiment, the extension regions 126, 128 may be recessed prior to the formation of the in-situ doped epi regions 138. The extension regions 126, 128 may be recessed using any suitable etching technique such as dry etch, wet etch, or combination of both. In one embodiment, a dry etch, for example chemical downstream etch (CDE), may be used to recess the extension regions 126, 128. In one embodiment, a wet etch, for example SC1 clean using NH3:H2O2:H2O mixtures, may be used to recess the extension regions 126, 128. The extension regions 126, 128 may be recessed by a depth ranging from about 2 nm to about 20 nm. Recessing the extension regions 126, 128 prior to the forming the in-situ doped epi regions 138 may be advantageous because filling the recesses with in-situ doped epi ensures overlap between the extension and the channel region to reduce the parasitic resistance and thus to enhance device performance. It should be noted the in-situ doped epi regions 138 depicted in FIG. 1H are vertically taller than those in-situ doped epi regions 138 depicted in FIGS. 1A-1G in order to depict their placement within the optional recess formed in the extension regions 126, 128. The vertical height of the in-situ doped epi regions 138 remains as described above.

Referring now to FIGS. 2A-2H a method of forming multiple field effect transistors with varying threshold voltages according to another embodiment will now be described in greater detail below.

Figure 2A:
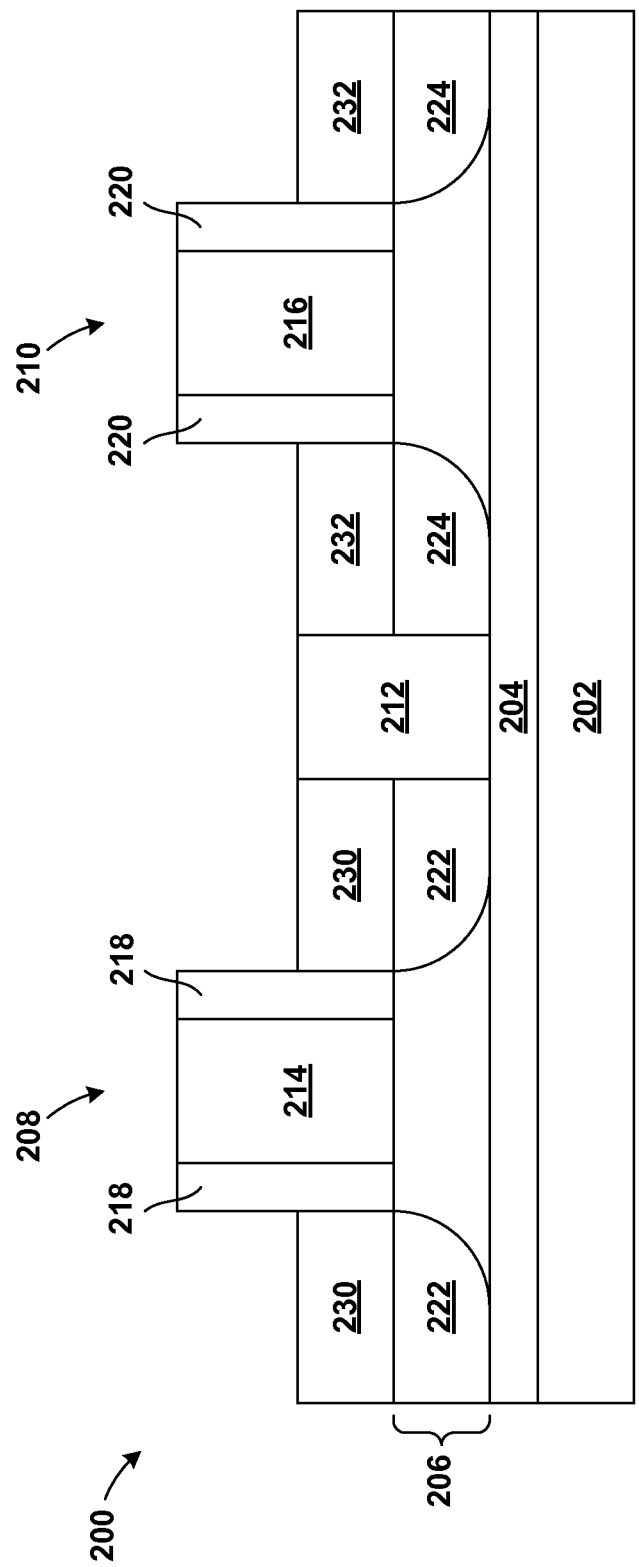
FIGS. 2A-2I illustrate the steps of a method of forming multiple FETs with different threshold voltages according to one exemplary embodiment.

Referring now to FIG. 2A, a structure 200 is shown. The structure 200 includes a SOI substrate. The SOI substrate employed in the present invention may include a base substrate 202, a buried dielectric layer 204 (e.g., buried oxide) formed on top of the base substrate 202, and a SOI layer 206 formed on top of the buried dielectric layer 204. The buried dielectric layer 204 isolates the SOI layer 206 from the base substrate 202. The base substrate 202 may be made from any of several known semiconductor materials such as, for example, a bulk silicon substrate. Other non-limiting examples include silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 204 may be about, but is not limited to, several hundred microns thick. For example, the base substrate 202 may include a thickness ranging from 0.5 mm to about 1.5 mm.

The buried dielectric layer 204 may be formed from any of several dielectric materials. Non-limiting examples include, for example, oxides, nitrides and oxynitrides of silicon. Oxides, nitrides and oxynitrides of other elements are also envisioned. In addition, the buried dielectric layer 204 may include crystalline or non-crystalline dielectric material. Moreover, the buried dielectric layer 204 may be formed using any of several methods. Non-limiting examples include ion implantation methods, thermal or plasma oxidation or nitridation methods, chemical vapor deposition methods and physical vapor deposition methods. In one embodiment, the buried dielectric layer 204 may be about 150 nm thick. Alternatively, the buried dielectric layer 204 may include a thickness ranging from about 10 nm to about 500 nm.

The SOI layer 206 may include any of the several semiconductor materials included in the base substrate 202. In general, the base substrate 202 and the SOI layer 206 may include either identical or different semiconducting materials with respect to chemical composition, dopant concentration and crystallographic orientation. In one particular embodiment of the present invention, the base substrate 202 and the SOI layer 206 include semiconducting materials that include at least different crystallographic orientations. Typically the base substrate 202 or the SOI layer 206 include a {110} crystallographic orientation and the other of the base substrate 202 or the SOI layer 206 includes a {100} crystallographic orientation. Typically, the SOI layer 206 includes a thickness ranging from about 5 nm to about 100 nm. Methods for making the SOI layer 206 are well known in the art. Non-limiting examples include SIMOX (Separation by Implantation of Oxygen), wafer bonding, and ELTRAN® (Epitaxial Layer TRANsfer).

With continued reference to FIG. 2A, a first semiconductor device 208 and a second semiconductor device 210 are shown at one stage of fabrication. Many different methods for forming semiconductor devices are known in the art. As an example, semiconductor devices may be fabricated using known replacement gate techniques. Replacement gate fabrication techniques generally include forming the semiconductor device around a dummy or sacrificial gate and later removing the dummy gate and replacing it with a metal gate. The semiconductor devices 208, 210 in FIG. 2A are shown with dummy gates 214, 216. For example, the dummy gates 214, 216 may be formed from silicon nitride. In one embodiment, the dummy gates 214, 216 may be formed form polysilicon.

Dummy spacers 218, 220 may then be formed, typically by conformally depositing or growing a dielectric such as silicon dioxide, followed by a directional etch that removes the dielectric from the horizontal surfaces while leaving it on the sidewalls of the dummy gate 214, 216. For example, the dummy spacers 218, 220 may include an oxide or nitride. In one embodiment, the dummy spacers 218, 220 may have a horizontal width ranging from about 3 nm to about 30 nm, with 10 nm being most typical.

Source/drain regions 222, 224 may be formed in the SOI layer 206 by using a suitable implant technique known in the art. The structure 200 may also include some form of isolation situated between semiconductor devices 208, 210 to electrically insulate them from one another. For example, a shallow trench isolation feature 212 may be used to insulate the semiconductor devices 208, 210 from each other.

In one embodiment, the semiconductor devices may be thin channel devices in which the SOI layer 206 may have a thickness of about 50 nm or less. Thin channel devices may be used to further address device scaling limitations. Thin channel devices may suffer from increased resistance due to the thinned SOI layer 206. One solution used to counter increased device resistance inherent in thin channel devices may be the use of raised source/drain regions 230, 232. The raised source/drain regions 230, 232 may be formed by selective epitaxial growth. In one embodiment, the raised source/drain regions 230, 232 may be formed by selective epitaxial SiGe growth for p-type devices and Si or Si:C for n-type devices. The epitaxy film can be doped either in-situ or ex-situ, for example during epitaxial growth or after epitaxial growth.

Figure 2B:
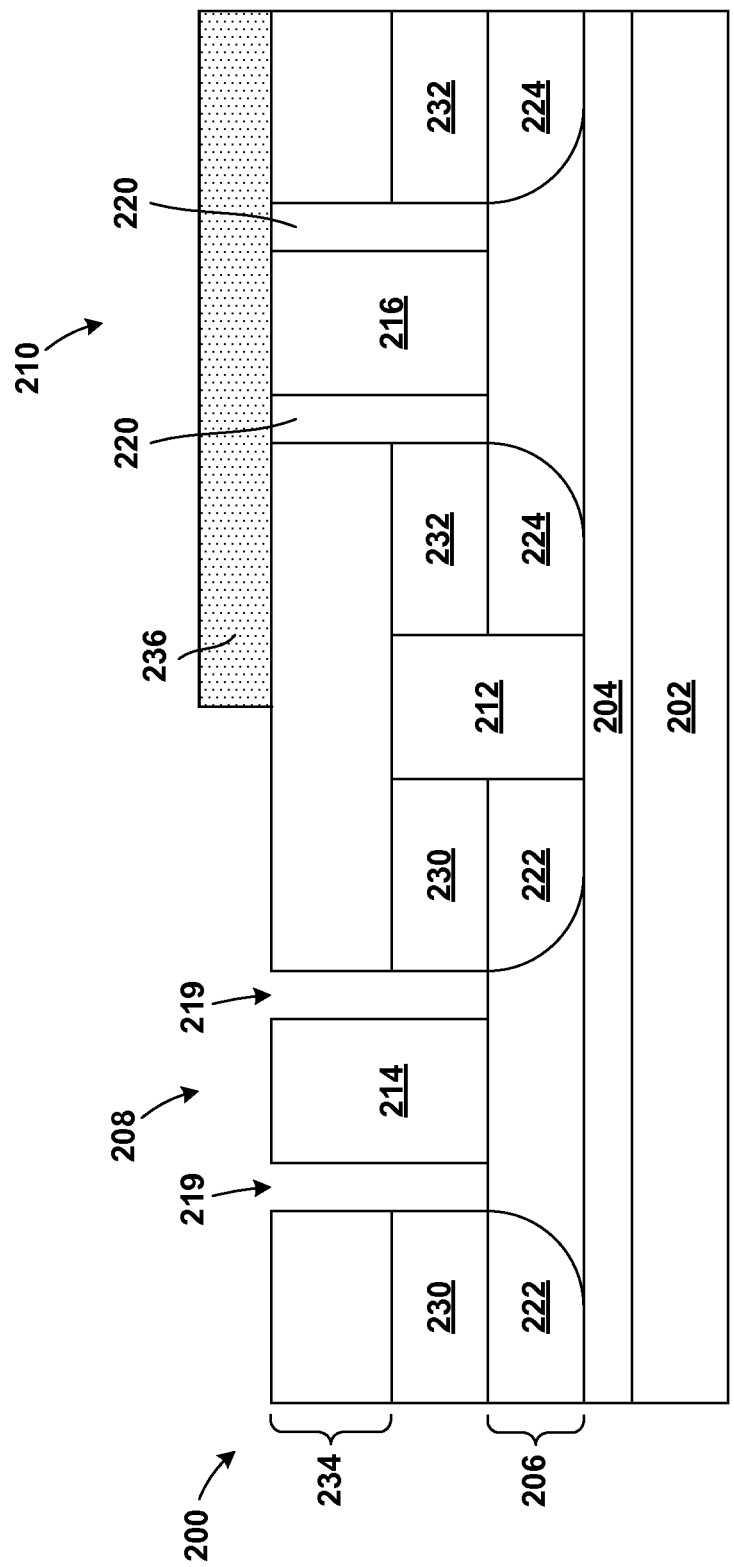

Referring now to FIG. 2B, an inter-layer dielectric (ILD) layer 234 may be deposited on top of the structure 200. A chemical mechanical polishing technique may be used to remove the excess ILD layer 234 selective to a top surface of the dummy gates 214, 216 and dummy spacers 218, 220. Thus, the ILD layer 234 remains between the semiconductor devices 208, 210 and on top of the raised source/drain regions 230, 232. Next, a first mask layer 236 may be applied above the second semiconductor device 210 and the dummy spacers 218 (shown in FIG. 2A) may be selectively removed producing a first pair of openings 219, as shown in FIG. 2B. The first mask layer 236 can be a soft mask such as photoresist or a hardmask layer such as silicon nitride. Soft mask is suitable for implantation and hardmask is suitable for epitaxy growth. When soft mask is used, it can be removed, for example, by ashing, after implantation but before dopant activation annealing. When hardmask mask is used, it can be removed either before or after dopant activation anneal. The dummy spacers 218 may be removed using any suitable etching technique such as dry etch, wet etch, or combination of both. The removal technique used to remove the dummy spacers 218 may be selective to the ILD layer 234 and the dummy gate 214.

Figure 2C:
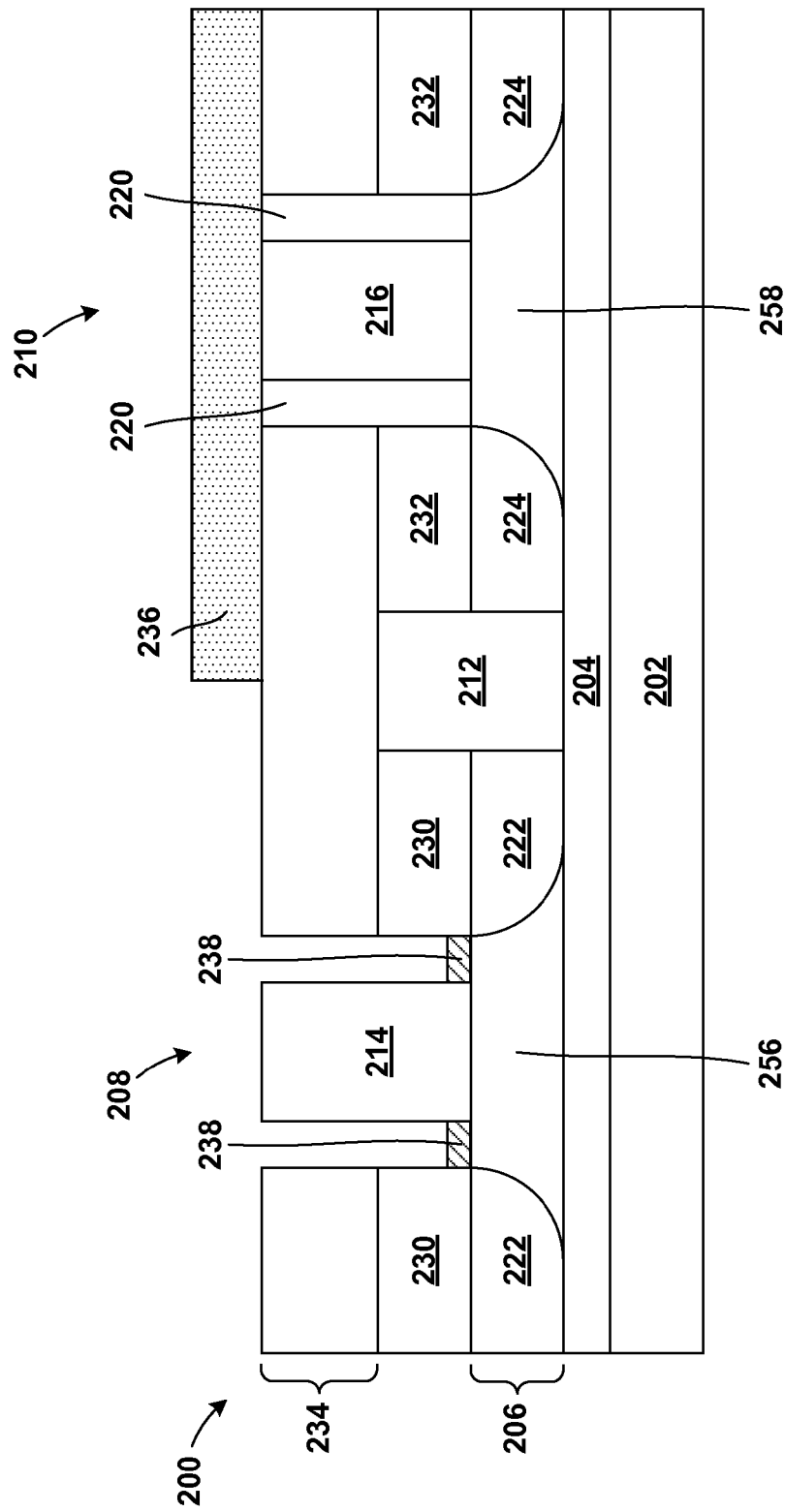

Referring now to FIG. 2C, an extension doping technique may be applied to the SOI layer 206 of the first semiconductor device 208. Depending on the dopants used the effective gate length of the first semiconductor device 208 may change while maintaining the device's physical gate length. The threshold voltage of a semiconductor device may strongly depend on the gate length of that particular device. A device having a relatively long effective gate length may have a relatively high threshold voltage, while a device having a relatively short effective gate length may have a relatively low threshold voltage. Generally, introduction of n-dopants into a p-doped extension region may increase the device's effective channel length thereby increasing the device's threshold voltage. Whereas, generally introduction of p-dopants into an n-doped extension region decreases the device's effective channel length thereby decreasing the device's threshold voltage.

In one embodiment, the extension doping technique may include the formation of a first pair of in-situ doped epi regions 238 above a channel region 256 of the first semiconductor device 208. Depending on the desired result epitaxial silicon, silicon germanium, of silicon carbon may be used. A number of different sources may be used for the deposition of epitaxial silicon, silicon germanium, and Si:C. n-type dopants such as phosphorus, arsenic, and p-type dopants such as boron and indium can be incorporated into epitaxy films during epitaxial growth. The temperature for epitaxial silicon deposition typically ranges from about 450° C. to about 900° C. The first pair of in-situ doped epi regions 238 may have a vertical thickness ranging from about 3 nm to about 15 nm, and may generally have a horizontal width, equal to or less than, one of the first pair of openings 219 produced by the removal of the dummy spacers 218.

In one embodiment, a p-type epitaxy film may be provided by selective-epitaxial growth of SiGe. The Ge content of the epitaxial grown SiGe may range from 5% to 60%, by atomic weight %. In another embodiment, the Ge content of the epitaxial grown SiGe may range from 10% to 40%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In yet another embodiment, the single crystal semiconductor material is composed of epitaxially grown Si:C or carbon doped silicon. The carbon (C) content of the epitaxial grown Si:C ranges from 0.3% to 10%, by atomic weight %. In another embodiment, the carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown.

Figure 2D:
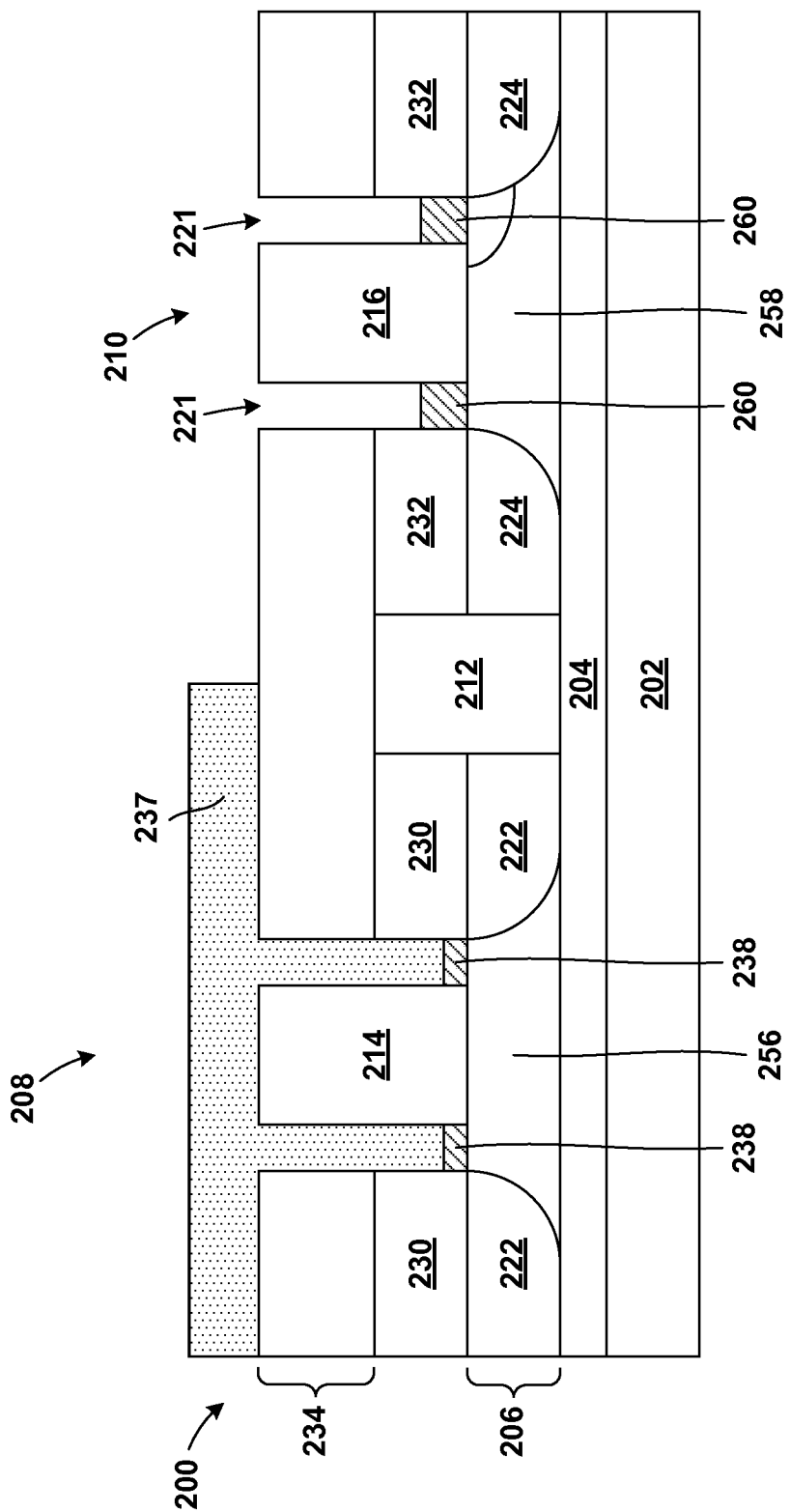

Referring now to FIG. 2D, after the first mask layer 236 has been removed, a second mask layer 237 may be applied above the first semiconductor device 208 and the dummy spacers 220 (shown in FIG. 2C) may be selectively removed producing a second pair of openings 221, as shown in FIG. 2D. The second mask layer 237 can be a soft mask such as photoresist or a hardmask layer such as silicon nitride. Soft mask is suitable for implantation and hardmask is suitable for epitaxy growth. When soft mask is used, it can be removed, for example, by ashing, after implantation but before dopant activation annealing. When hardmask mask is used, it can be removed either before or after dopant activation anneal. The dummy spacers 220 may be removed using any suitable etching technique such as dry etch, wet etch, or combination of both. The removal technique used to remove the dummy spacers 220 may be selective to the ILD layer 234 and the dummy gate 216.

With continued reference to FIG. 2D, an extension doping technique may be applied to the SOI layer 106 of the second semiconductor device 210. Depending on the dopants used the effective gate length of the second semiconductor device 210 may change while maintaining the device's physical gate length. The threshold voltage of a semiconductor device may strongly depend on the gate length of that particular device. A device having a relatively long effective gate length may have a relatively high threshold voltage, while a device having a relatively short effective gate length may have a relatively low threshold voltage. Generally, introduction of n-dopants into a p-doped extension region may increase the device's effective channel length thereby increasing the device's threshold voltage. Whereas, generally introduction of p-dopants into an n-doped extension region decreases the device's effective channel length thereby decreasing the device's threshold voltage.

In one embodiment, the extension doping technique may include the formation of a second pair of in-situ doped epi regions 260 above a second channel region 258 of the second semiconductor device 210. Depending on the desired result epitaxial silicon, silicon germanium, of silicon carbon may be used. A number of different sources may be used for the deposition of epitaxial silicon, silicon germanium, and Si:C. N-type dopants such as phosphorus, arsenic, and p-type dopants such as boron and indium can be incorporated into epitaxy films during epitaxial growth. The temperature for epitaxial silicon deposition typically ranges from about 450° C. to about 900° C. The second pair of in-situ doped epi regions 260 may have a vertical thickness ranging from about 3 nm to about 15 nm, and may generally have a horizontal width, equal to or less than, one of the second pair of openings 221 produced by the removal of the dummy spacers 220.

In one embodiment, a p-type epitaxy film may be provided by selective-epitaxial growth of SiGe. The Ge content of the epitaxial grown SiGe may range from 5% to 60%, by atomic weight %. In another embodiment, the Ge content of the epitaxial grown SiGe may range from 10% to 40%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In yet another embodiment, the single crystal semiconductor material is composed of epitaxially grown Si:C or carbon doped silicon. The carbon (C) content of the epitaxial grown Si:C ranges from 0.3% to 10%, by atomic weight %. In another embodiment, the carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown.

After deposition of the first and second pair of in-situ doped epi regions 238, 260 an annealing process may be performed on the structure 200 to further activate the dopants. For example, a flash anneal or laser anneal may be used to activate the dopants.

In one embodiment the annealing process may be carried out at a relatively high annealing temperature, ranging from about 700° C. to about 1350° C. using either a continuous heating regime or various ramp and soak heating cycles, for a duration ranging from about 1 nano second to about 1000 seconds. More preferably, the first annealing step may be carried out at an annealing temperature ranging from about 900° C. to about 1300° C. and for a duration ranging from about 1 millisecond to about 1 second. Most preferably, the first annealing step may be carried out at an annealing temperature ranging from about 1000° C. to about 1250° C. and for a duration from about 1 milliseconds to about 100 milliseconds. In one embodiment, the first annealing step may be initiated by raising the surrounding temperature of the entire structure from ambient temperature to the desired annealing temperature at a ramp rate from about 10° C./second to about 300° C./second, more preferably from about 50° C./second to about 200° C./second, and most preferably from about 100° C./second to about 150° C./second. Further, it is preferred that the annealing process may be terminated by lowering the surrounding temperature of the entire structure to below 100° C. within a time period from about 1 seconds to about 1000 seconds. As a result of the annealing process the dopants introduced in the in-situ doped epi regions 238 may further migrate downward into the SOI layer 206.

Figure 2E:
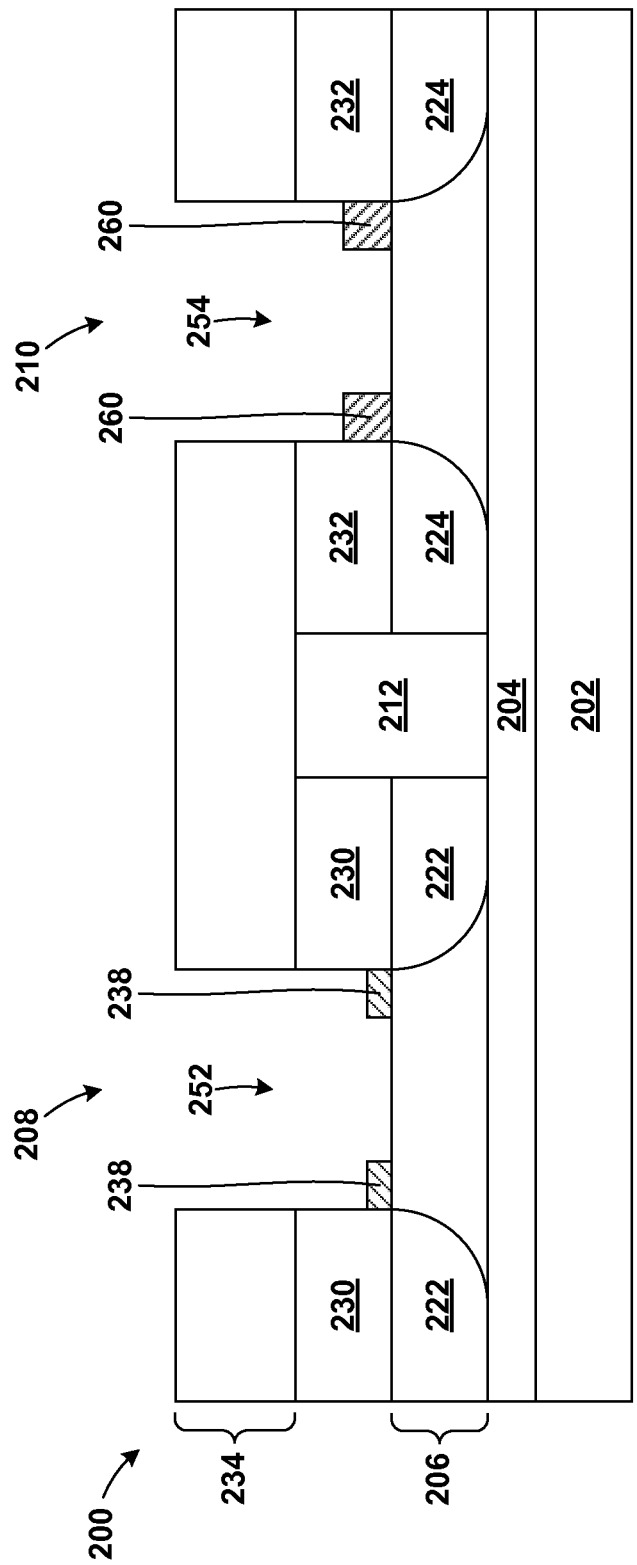

Referring now to FIG. 2E, after the second mask layer 237 has been removed the dummy gates 214, 216 may be removed using any suitable etching technique such as dry etch, wet etch, or a combination of both. In one embodiment, the dummy gates 214, 216 may be removed using dry etch such as plasma etch. Removal of the dummy gates 214, 216 yields a first opening 252 at the first device 208 and a second opening 254 at the second device 210.

Figure 2F:
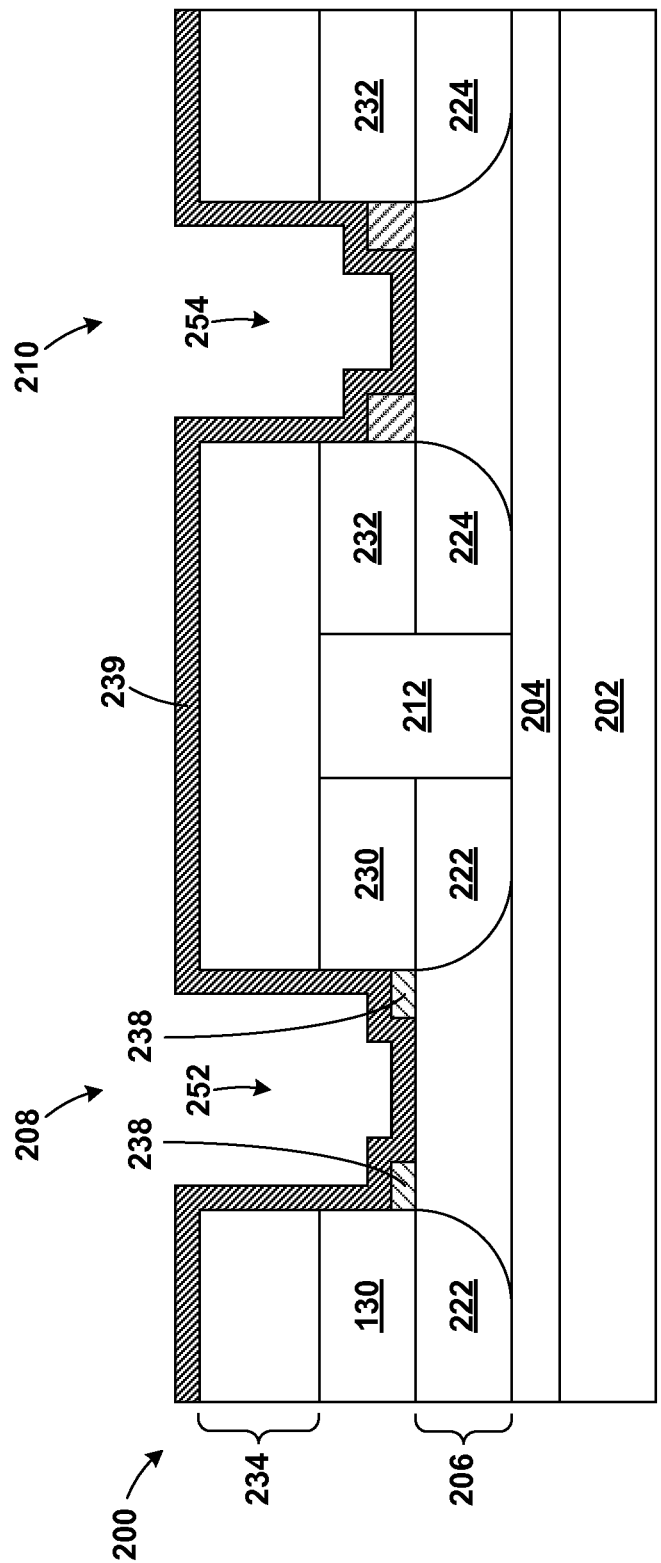

Referring now to FIG. 2F, a dielectric material 239 may be conformally deposited on the surface of the structure 200 including within the openings 252, 254. The dielectric material 239 may be deposited by any technique known in the art, for example by atomic layer deposition (ALD), chemical vapor deposition (CVD), atomic layer deposition (PVD), molecular beam deposition (MBD), pulsed laser deposition (PLD), or liquid source misted chemical deposition (LSMCD). The dielectric material 239 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum. In one embodiment the dielectric material 239 may be silicon nitride. The dielectric material 239 may be deposited with a thickness ranging from about 3 nm to about 30 nm, and more typically from about 5 nm to about 10 nm. A removal technique, for example reactive ion etching, may be used to removed the dielectric material 239 from the horizontal surfaces including a top surface of the ILD layer 234 and the bottoms of the openings 252, 254 while leaving it on the sidewalls of the openings 252, 254. The dielectric material 239 remaining on the sidewalls of the openings 252, 254 forms sidewall spacers 240, 242, as shown in FIG. 2G.

Figure 2G:
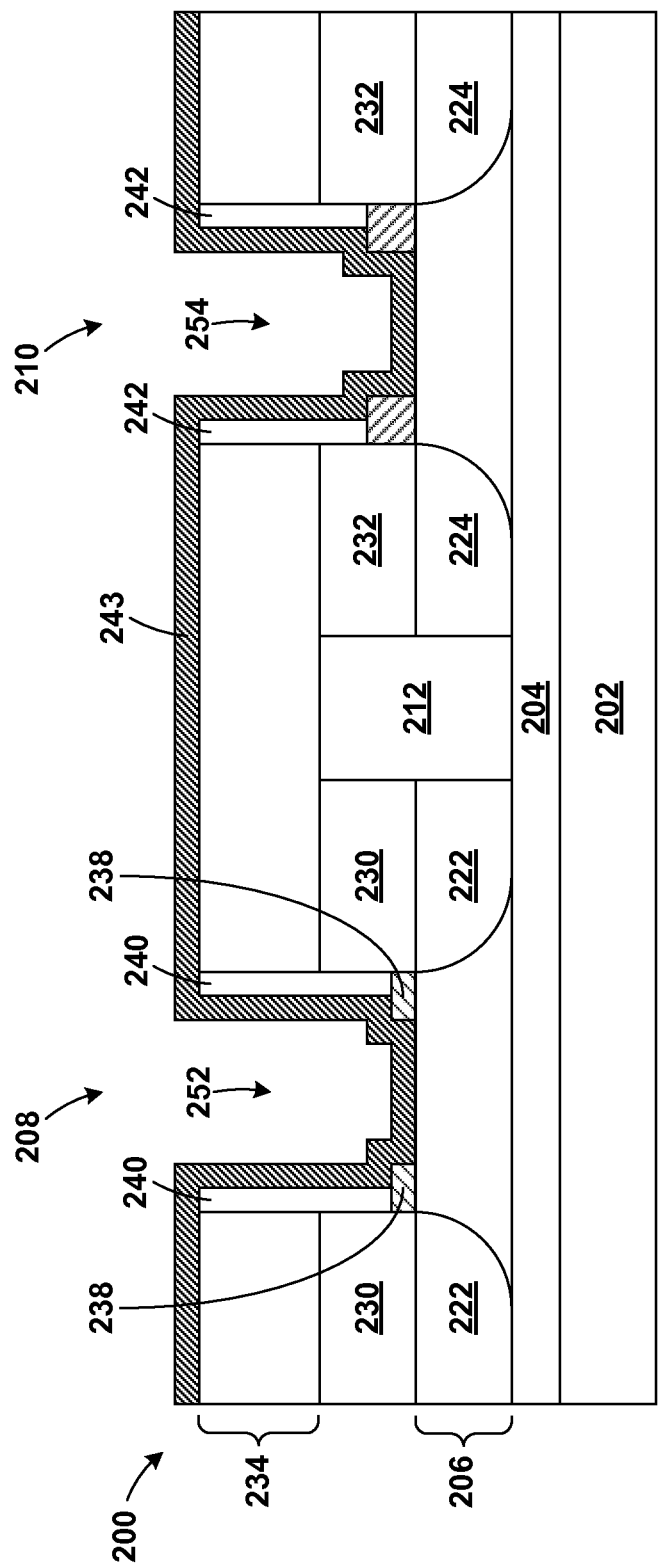

Referring now to FIG. 2G, a gate dielectric layer 243 may be conformally deposited on the surface of the structure 200 including within the openings 252, 254 and on top of the sidewall spacers 240, 242. The gate dielectric layer 243 may be deposited by any technique known in the art, for example by atomic layer deposition (ALD), chemical vapor deposition (CVD), atomic layer deposition (PVD), molecular beam deposition (MBD), pulsed laser deposition (PLD), or liquid source misted chemical deposition (LSMCD).

The gate dielectric layer 243 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum. The gate dielectric layer 243 may be deposited with a thickness ranging from about 0.5 nm to about 6 nm, and more typically from about 1.2 nm to about 3 nm. The gate dielectric layer 243 may have an effective oxide thickness on the order of or less than 1 nm.

Figure 2H:
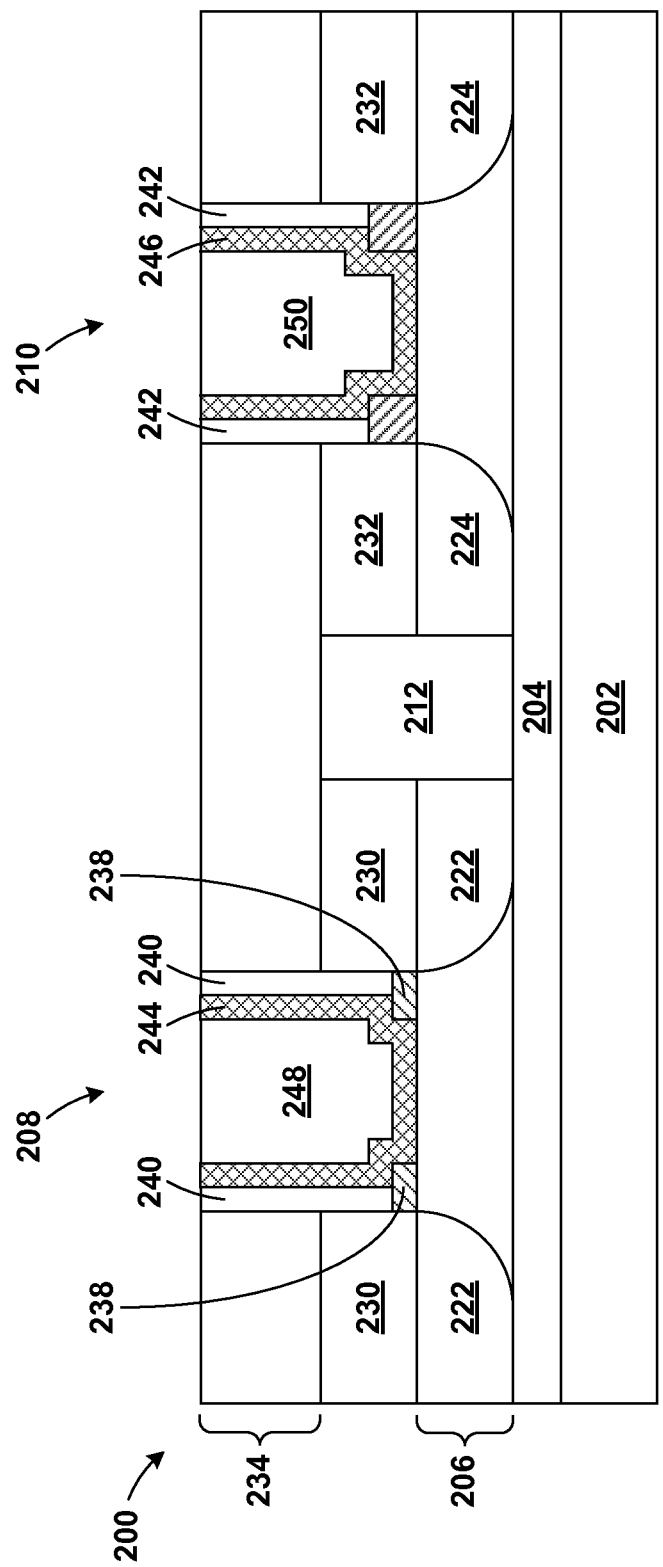

Referring now to FIG. 2H, metal gates 248, 250 may be formed on top of the gate dielectrics 244, 246. The metal gates 248, 250 may be deposited by any technique known in the art, for example by atomic layer deposition (ALD), chemical vapor deposition (CVD), atomic layer deposition (PVD), molecular beam deposition (MBD), pulsed laser deposition (PLD), or liquid source misted chemical deposition (LSMCD). The metal gates 248, 250 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC, and any combination of those materials.

A chemical mechanical polishing technique may be used to remove the metal gate 248, 250 from the top of the structure 100 while leaving it on the sidewalls and bottoms of the openings 252, 254. The gate dielectric layer 243 can be removed selective to the top surface of the ILD layer 234. The gate dielectric layer 243 remaining on the sidewalls and bottoms of the openings 252, 254 forms gate dielectrics 244, 246, as shown in FIG. 2H.

Furthermore, a gate capping layer (not shown) may be positioned on top of the metal gates 148, 150. The gate capping layer may include, for example, TiN, W, Ti, Al, Ta, TaN, Co, and Ni.

Figure 2I:
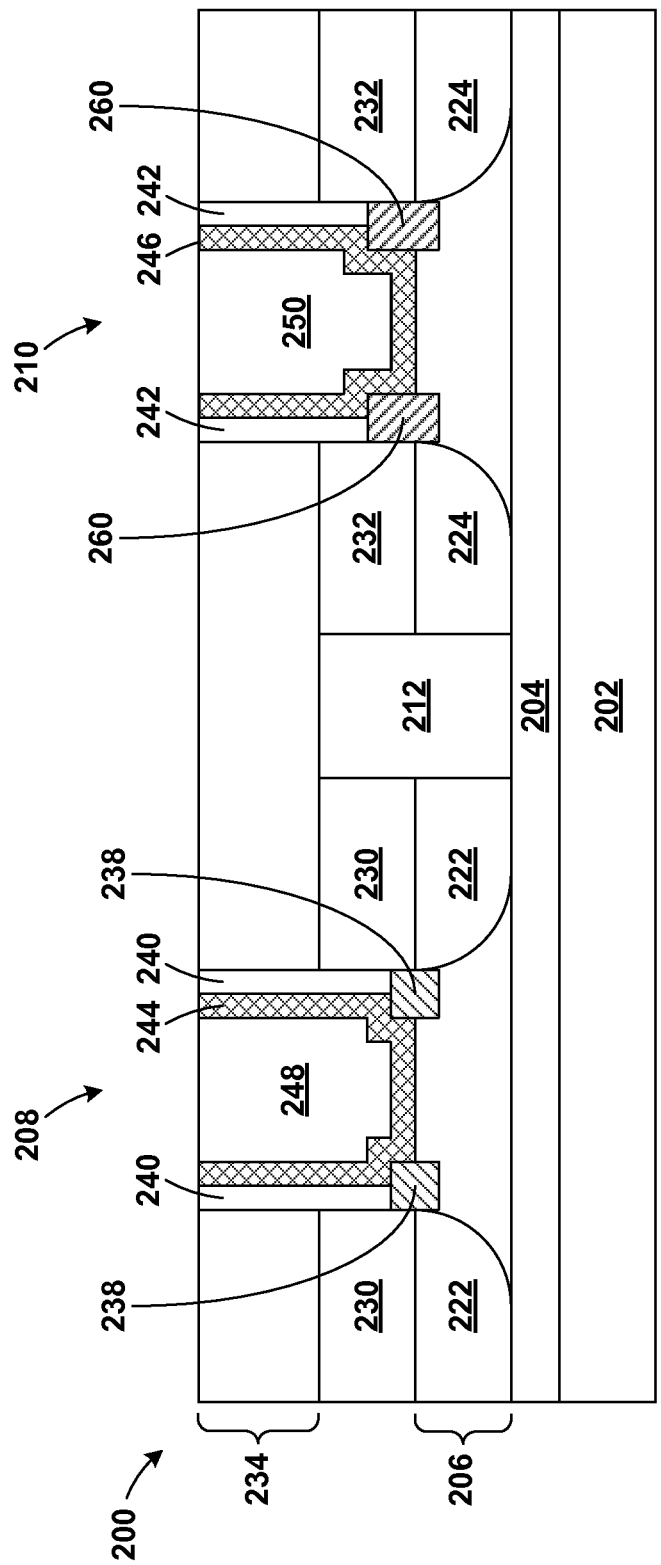

Referring now to FIG. 2I, in one embodiment, the SOI layer 206 may be recessed prior to the formation of the first and second pairs of in-situ doped epi regions 238, 260. The SOI layer 206 may be recessed using any suitable etching technique such as dry etch, wet etch, or combination of both. In one embodiment, a dry etch, for example chemical downstream etch (CDE), may be used to recess the SOI layer 206. In one embodiment, a wet etch, for example SC1 clean using NH3:H2O2:H2O mixtures, may be used to recess the SOI layer 206. The SOI layer 206 may be recessed by a depth ranging from about 2 nm to about 20 nm. Recessing the SOI layer 206 prior to the forming the first and second pairs of in-situ doped epi regions 238, 260 may be advantageous because filling the recesses with in-situ doped epi ensures overlap between the extension and the channel region to reduce the parasitic resistance and thus to enhance device performance. It should be noted the first pair of in-situ doped epi regions 238 depicted in FIG. 2I are vertically taller than the in-situ doped epi regions 238 depicted in FIGS. 2A-2I in order to depict their placement within the optional recess formed in the SOI layer 206. The vertical height of the first and second pairs of in-situ doped epi regions 238, 260 remains as described above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
providing a semiconductor substrate comprising a first semiconductor device and a second semiconductor device, wherein the first and second semiconductor devices comprising dummy spacers, and dummy gates;
protecting the second semiconductor device with a first mask;
removing the dummy spacers from the first semiconductor device;
depositing in-situ doped epitaxial regions on top of the semiconductor substrate of the first semiconductor device;
protecting the first semiconductor device with a second mask;
removing the dummy spacers from the second semiconductor device; and
depositing in-situ doped epitaxial regions on top of the semiconductor substrate of the second semiconductor device.

2. The method of claim 1, wherein the in-situ doped epitaxial regions are doped with n-type dopants.

3. The method of claim 2, wherein the n-type dopants are selected from the group consisting of: phosphorus and arsenic.

4. The method of claim 1, wherein the in-situ doped epitaxial regions are doped with p-type dopants.

5. The method of claim 4, wherein the p-type dopants are selected from the group consisting of: boron and indium.

6. The method of claim 1, wherein the in-situ doped epitaxial regions have a vertical thickness ranging from about 3 nm to 15 nm.

7. The method of claim 1, further comprising:
removing a portion of the semiconductor substrate of the first and second semiconductor device prior to depositing the in-situ doped epitaxial regions.

8. The method of claim 1, wherein the in-situ doped epitaxial regions comprise n-type dopants, and a source region, a drain region, and the extension regions of the first semiconductor device comprise n-type dopants.

9. The method of claim 1, wherein the in-situ doped epitaxial regions comprise p-type dopants, and a source region, a drain region, and the extension regions of the first semiconductor device comprise p-type dopants.

10. The method of claim 1, wherein the in-situ doped epitaxial regions comprise n-type dopants, and a source region, a drain region, and the extension regions of the first semiconductor device comprise p-type dopants.

11. The method of claim 1, wherein the in-situ doped epitaxial regions comprise p-type dopants, and a source region, a drain region, and the extension regions of the first semiconductor device comprise n-type dopants.

12. The method of claim 1, further comprising:
removing the dummy gates from the first and second semiconductor device;
depositing dielectric spacers;
depositing a gate dielectric; and
depositing metal gates.

* * * * *